(12) United States Patent
Kurita et al.

(10) Patent No.: US 7,803,228 B2
(45) Date of Patent: *Sep. 28, 2010

(54) PROCESS FOR PRODUCING HIGH-RESISTANCE SILICON WAFERS AND PROCESS FOR PRODUCING EPITAXIAL WAFERS AND SOI WAFERS

(75) Inventors: Kazunari Kurita, Tokyo (JP); Shinsuke Sadamitsu, Tokyo (JP); Hiroyuki Takao, Tokyo (JP); Masataka Hourai, Tokyo (JP)

(73) Assignee: Sumco Corporation, Tokyo (JP)

( * ) Notice: Subject to any disclaimer, the term of this patent is extended or adjusted under 35 U.S.C. 154(b) by 502 days.

This patent is subject to a terminal disclaimer.

(21) Appl. No.: 10/576,321

(22) PCT Filed: Aug. 2, 2004

(86) PCT No.: PCT/JP2004/011050

§ 371 (c)(1),
(2), (4) Date: Apr. 19, 2006

(87) PCT Pub. No.: WO2005/038899

PCT Pub. Date: Apr. 28, 2005

(65) Prior Publication Data

US 2007/0066033 A1    Mar. 22, 2007

(30) Foreign Application Priority Data

Oct. 21, 2003    (JP) .............................. 2003-360251

(51) Int. Cl.
*C30B 15/14* (2006.01)
(52) U.S. Cl. .............................. 117/13; 117/18; 117/20
(58) Field of Classification Search .................... 117/1; 257/1; 428/1; 438/1
See application file for complete search history.

(56) References Cited

U.S. PATENT DOCUMENTS 5,445,975 A    8/1995    Gardner et al.

(Continued)

FOREIGN PATENT DOCUMENTS

EP    0 889 510    1/1999

(Continued)

OTHER PUBLICATIONS

U.S. Appl. No. 10/512,405, Takase et al., filed Jun. 15, 2005.*

(Continued)

*Primary Examiner*—Robert M Kunemund
(74) *Attorney, Agent, or Firm*—Clark & Brody

(57) ABSTRACT

By using oxygen-containing silicon wafers obtained by the CZ method and by combining the first heat treatment comprising controlled heat-up operation (ramping) with the second heat treatment comprising high-temperature heat treatment and medium temperature heat treatment in accordance with the process for producing high-resistance silicon wafers according to the present invention, it is possible to obtain high-resistance silicon wafers capable of maintaining their high resistance even after heat treatment in the process of device manufacture while efficiently inhibiting the formation of oxygen donors and preventing changes in resistivity. Further, excellent epitaxial wafers and SOI wafers can be produced using those high-resistance silicon wafers and, therefore, they can be applied in a wide field including high-frequency communication devices and analog/digital hybrid devices, among others.

8 Claims, 5 Drawing Sheets

U.S. PATENT DOCUMENTS

| | | |
|---|---|---|
| 6,544,656 B1 | 4/2003 | Abe et al. |
| 2002/0179003 A1 | 12/2002 | Iida et al. |
| 2003/0008435 A1* | 1/2003 | Falster et al. ............... 438/149 |
| 2003/0054641 A1 | 3/2003 | Binns et al. |
| 2004/0102056 A1* | 5/2004 | Tobe et al. ............... 438/795 |
| 2005/0250349 A1* | 11/2005 | Sadamitsu et al. ............ 438/800 |

FOREIGN PATENT DOCUMENTS

| | | |
|---|---|---|
| EP | 1087041 A1 | 3/2001 |
| EP | 1229155 | 8/2002 |
| EP | 1 326 270 | 7/2003 |
| JP | 10-150048 | 6/1998 |
| JP | 2000-100631 | 4/2000 |
| JP | 2000-344598 | 12/2000 |
| JP | 2003-286094 | 10/2003 |
| WO | WO00/55397 | 9/2000 |
| WO | WO01/79593 | 10/2001 |
| WO | 03/060982 | 7/2003 |
| WO | WO03/092065 | 11/2003 |
| WO | WO2004/008521 | 1/2004 |

OTHER PUBLICATIONS

U.S. Appl. No. 10/519,837, Sadamitsu et all, filed Jul. 5, 2005.*

M. Akatsuka et al., "Pinning Effect on Punched-Out Dislocations in Silicon Wafers Investigated Using Indentation Method", Jpn. J. Appl. Phys., vol. 36 (1997), pp. 1422-1425.

K. Sueoka et al., "Effect of Oxide Precipitate Sizes on the Mechanical Strength of Czochralski Silicon Wafers", Jpn. J. Appl. Phys., vol. 36 (1997), pp. 7095-7099.

A. Bean et al., "The Effect of Carbon on Thermal Donor Formation in Heat Treated Pulled Silicon Crystals", J. Phys. Chem. Solids, vol. 33 (1972), pp. 255-268.

* cited by examiner (a) First heat treatment (b) Second heat treatment

US 7,803,228 B2

PROCESS FOR PRODUCING HIGH-RESISTANCE SILICON WAFERS AND PROCESS FOR PRODUCING EPITAXIAL WAFERS AND SOI WAFERS

TECHNICAL FIELD

This invention relates to a process for producing high-resistance silicon wafers to be used, for example, as base substrates for radio frequency communication devices or analog/digital hybrid devices, and to a process for producing epitaxial wafers and SOI (silicon-on-insulator) wafers using the high-resistance silicon wafers obtained by the process mentioned above.

BACKGROUND ART

As far as the CMOS process is concerned, low-cost RF-CMOS-LSIs for use in the RF (radio frequency) range have become realized with the rapid progress in RF characteristics of circuits. Significant applications thereof include, among others, transceiver ICs for portable devices, wireless LAN transceiver ICs suited for high speed, great capacity transmission, or analog/digital hybrid devices.

Since the RF characteristics attainable in the CMOS process were poor in the past, the cost of RF-CMOS circuit production was high, and the design of high-frequency circuits to be produced by the CMOS process has not been actively studied. Therefore, in the prior art high-frequency circuit designing, circuit substrates based on compound semiconductors such as GaAs have been in the mainstream. However, such substrates as GaAs-based ones are expensive from the production cost viewpoint and present problems when the wafer diameter is to be increased, and from the crystal defect controllability viewpoint, for instance, although they are excellent in RF characteristics.

On the contrary, silicon wafers are excellent in wafer diameter increasability and crystal defect controllability and are characterized by low production costs. Therefore, it is conceivable that silicon wafers be used as RF-CMOS circuit substrates but, generally, when silicon wafers with a resistance value of 10 Ωcm or below are used as circuit substrates, there is a limit to the improvement in performance characteristics of RF-ICs.

This is because, unlike digital circuits, RF circuits utilize on-chip inductor elements, highly fine capacitor elements and other analog passive elements and, in particular, the characteristics of inductors are greatly influenced by the parasitic effect of silicon wafer substrates; thus, the improvement in device performance characteristics by process refining alone is limited. For improving the device performance characteristics, it is therefore necessary to increase the resistivity of silicon wafers.

In the case of analog/digital hybrid devices, it is demanded that high-resistance silicon substrates be supplied so that the deep substrate noises produced in digital circuits may be inhibited from propagating to analog circuits.

However, silicon crystals produced by the Czochralski method (hereinafter, "CZ method") contain oxygen therein at supersaturation levels, since the crystal growth is carried out utilizing a quartz crucible. This oxygen leads to the formation of oxygen donors called thermal donors or new donors in the heat treatment step in the device production process, causing changes in substrate resistivity as found after heat treatment in a step or steps in the device production process.

FIG. 1 is a schematic representation of the relation between oxygen donor occurrence level and wafer resistivity. In the case of low-resistance wafers with a resistivity of about 10 Ωcm, the dopant level is sufficiently high as compared with the level of generation of oxygen donors and therefore, even when oxygen donors are generated, their influence on the resistivity is insignificant. In the case of high-resistance wafers, however, the dopant level is low and the resistivity thereof is greatly influenced by the amount of oxygen donors generated.

In the case of p-type wafers, in particular, the conductivity brought about by acceptor-due positive holes disappears by the donor-due supply of electrons and the resistivity increases markedly and, upon further increase in the number of donors, an inversion occurs to n-type semiconductors and the resistivity decreases. Heating in a temperature range in which oxygen donors are readily generated is inevitably carried out as a heat treatment step in the device production process, for example in heat treatment for sintering in the wiring sintering step.

Attempts have been made to prevent the changes in resistivity as found after the device production by employing the magnetic-field-applied crystal growth method (MCZ method) to thereby reduce the solute oxygen concentration in the crystal. However, the method based on the magnetic field application leads to an increase in production costs and, in addition, reportedly, the lower limit to the solute oxygen concentration attainable with large-diameter crystals is still as high as $6 \times 10^{17}$ atoms/cm$^3$, indicating that there is a limit to that technology in growing extra-low-oxygen crystals. Further, as the oxygen content in crystals decreases, there arises a fear of the mechanical strength of the crystals being found deteriorated after heat treatment in the device production process.

In recent years, various proposals have been made to solve such problems. First, International Publication No. WO 00/55397 (hereinafter, "Document 1") discloses a process comprising the steps of processing a single crystal produced by the CZ method and having a resistivity of 100 Ωcm or above and a normal oxygen content, namely an initial interstitial oxygen (solute oxygen) concentration of 10-25 ppma ($7.9 \times 10^{17}$ to $19.8 \times 10^{17}$ atoms/cm$^3$ [Old ASTM]) to wafers, and subjecting the wafers to oxygen precipitation treatment to lower the residual interstitial oxygen concentration to 8 ppma ($6.4 \times 10^{17}$ atoms/cm$^3$ [Old ASTM]) or below. The wafers obtained in this way allegedly show no decrease in resistivity upon heat treatment in the device production process as a result of inhibited oxygen donor generation.

Japanese Patent Application Publication No. 2000-100631 (hereinafter, "Document 2") discloses an invention concerning the requirements to be met by high-resistance wafers having a resistivity of 100 Ωcm or above which are to be subjected to the so-called DZ-IG treatment mentioned above as well as the treatment conditions. According to this invention, like the invention described in Document 1, each wafer has an interstitial oxygen concentration of 8 ppm or below at every part of the wafer, has a DZ (denuded zone) in the vicinity of the surface and an oxygen precipitate layer in the bulk portion and, in addition, has a transition zone of 5 μm or below in width between the DZ and oxygen precipitate layer.

According to the methods proposed in Documents 1 and 2 cited above, general-purpose silicon crystals having a high oxygen concentration are used and, therefore, the production cost can be cut, and the residual oxygen concentration is reduced by the subsequent heat treatment for oxygen precipitation. Therefore, the silicon wafers obtained have a reduced residual oxygen concentration, so that the generation of oxygen donors in the heat treatment step in the device production process can be effectively inhibited. Further, allegedly, an improvement in gettering capacity can be expected by causing a high density of oxygen precipitate defects to be formed inside of the wafer (in the bulk portion) in view of the oxygen precipitation heat treatment carried out to reduce the residual oxygen concentration.

As described above, the methods proposed in Documents 1 and 2 cited above are the methods which comprise subjecting high-resistance wafers with a high oxygen concentration, after the manufacture thereof, to a long duration heat treatment for oxygen precipitation to thereby form a high density of oxygen precipitates and sufficiently reduce the residual oxygen concentration. However, it is not always easy to reduce the residual oxygen concentration to a level of 8 ppma or below by selecting the heat treatment conditions. In addition, some problems arise thereby.

A first problem is that the mechanical strength of wafers is markedly deteriorated because the residual oxygen concentration in wafers is reduced sufficiently, or in other words, the residual oxygen concentration is reduced excessively. Thus, slip dislocations originating from wafer supporting sites, for instance, during heat treatment are immobilized by oxygen and, as a result, the slip lengths may decrease with the increase in oxygen concentration (see for example M. Akatsuka et al., Jpn. J. Appl. Phys., 36 (1997), L1422).

Further, oxygen precipitates serve as a factor giving strength to wafers and, while the thermal stress or tare stress is low, they can prevent the movement of slip dislocations and thereby increase the strength. When such stress increases, oxygen precipitates themselves serve as sources of slip dislocations, possibly causing a decrease in strength and/or wafer warping (see for example K. Sueoka et al., Jpn. J. Appl. Phys., 36 (1997) 7095).

A second problem is an increase in production cost as a result of long-duration heat treatment for oxygen precipitation. For reducing the residual oxygen concentration in the bulk portion, it is necessary to cause the formation of oxygen precipitates at a high density; hence it becomes necessary to carry out a long-duration heat treatment at elevated temperatures. Accordingly, the oxygen precipitation heat treatment causes an increase in production cost. Thus, even when the costs of production of initial wafers can be cut, the price of final product wafers cannot but increase.

A third problem is concerns about heavy metal contamination in the heat treatment furnace as resulting from the oxygen precipitation heat treatment. According to the results of investigations made by the present inventors, the heat treatment process proposed in Document 2 cited above requires at least 17 hours and extends to 47 hours of heating at the most. In view of the necessity of such a long-duration oxygen precipitation heat treatment, the risk of heavy metal contamination in the heat treatment furnace cannot be denied.

DISCLOSURE OF THE INVENTION

It is an object of the present invention, having been made in view of the above-discussed problems of the oxygen precipitation heat treatment to be applied in producing high-resistance wafers, to provide a process for producing high-resistance wafers which comprises subjecting high-resistance wafers grown by the CZ method with the addition of carbon to a preliminary heat treatment by a controlled heat-up procedure (ramping) in combination with the subsequent high-temperature heat treatment and medium-temperature heat treatment, thereby enabling the production cost to be reduced, enabling the generation of oxygen donors after heat treatment in the device production process to be effectively prevented, and enabling the gettering capacity and mechanical strength of wafers to be secured further.

Those high-resistance silicon wafers having good characteristics and free of the problems worried about in the conventional production of high-resistance wafers can be used as epitaxial wafers and, further, satisfactorily as SOI wafers for mobile telecommunications. Accordingly, it is another object of the present invention to provide a process for producing epitaxial wafers and SOI wafers using the above-mentioned high-resistance silicon wafers.

To accomplish the above objects, the present inventors paid their attention to the excessive formation of oxygen precipitates and the resulting marked decrease in residual oxygen concentration in wafers as encountered on the occasion of oxygen precipitation heat treatment and made investigations concerning the formation behavior of oxygen precipitates in high-resistance silicon wafers and, further, concerning the situation of oxygen donor formation as influenced by the oxygen precipitate formation.

As a result, it was found that the addition of carbon to wafers results in promoting an oxygen precipitation and, at the same time, is effective in preventing the formation of oxygen donors, in particular in preventing the formation of thermal donors.

It is known in the art that the addition of carbon is effective in preventing the formation of oxygen donors in silicon wafers low in resistivity (see for example A. B. Bean et al., J. Phys. Chem. Solids, 1972, Vol. 33, pp. 255-268). More specifically, when the resistivity is 10 Ωcm or below, the carbon addition level required for inhibiting oxygen donors is $1 \times 10^{18}$ atoms/cm$^3$.

However, the addition of carbon at such a high concentration to silicon wafers having a high resistivity of 100 Ωcm or above is estimated to produce such problems as dislocations. In spite of this estimation, it was found that even in the case of high-resistance wafers with an initial resistivity of 100 Ωcm or above, there is a carbon concentration range which will not influence the formation of single crystals and, when carbon is added in a controlled manner within such a range, it can promote the oxygen precipitation and is also effective in controlling the formation of oxygen donors, without causing such problems as dislocations.

Further, it was found that oxygen donors such as new donors can be more effectively controlled by the combined use of a controlled heat-up procedure (ramping) with high-temperature heat treatment and medium-temperature heat treatment. More specifically, the oxygen donor formation can be effectively prevented by carrying out a first heat treatment in which the rate of heat-up is controlled and a second heat treatment comprising a high-temperature treatment at 1150° C. or above and the subsequent-medium-temperature heat treatment at 1000-1150° C.

When wafers with a high oxygen concentration are used, the growth of precipitation nuclei is sufficiently promoted until arrival at a state of saturated nucleus growth in the first heat treatment in which the rate of heat-up is controlled and, further, the oxygen donor formation can be controlled also by modifying the second heat treatment conditions. Furthermore, the excessive formation of oxygen precipitates is no more necessary and, accordingly, the heat treatment-due production cost can be reduced. Further, the excessive oxygen precipitation is inhibited and, therefore, the wafers can be improved in mechanical-strength.

As shown in FIG. 1 referred to hereinabove, the resistivity of high-resistance silicon wafers is greatly influenced by the amount of oxygen donors generated. In the case of p-type wafers, in particular, the increase in the amount of oxygen donors formed may result in the inversion to n-type semiconductors and/or great changes in resistivity. When the resistivity of the wafer inside becomes too low due to that decrease in resistivity, the amount of current passing through a place deeper than the region for device manufacture increases and causes energy losses and/or produces current noises, thus markedly deteriorating the device characteristics.

The oxygen donors formed include thermal donors (old donors) estimated to be oxygen clusters, and new donors considered to be minute precipitates in initial form. Presumably, these oxygen donors are dissolved or undergo a modification in the manner of bonding and electrically neutralized during the above-mentioned first heat treatment and second heat treatment and, accordingly, their formation is suppressed.

As a result of various investigations concerning oxygen donors, the present inventors, premised on the heat treatment employed in device manufacture, could reveal the permissible limit level of oxygen donors formed in the wafer inside after such heat treatment. Thus, in the case of high-resistance wafers with an initial resistance of 100 Ωcm or above, when the amount of oxygen donors formed as found after heat treatment in the device manufacture is $1 \times 10^{13}$ atoms/cm$^3$ or below, the wafer resistivity can be maintained thereafter at a high level, the resistance values can be prevented from changing greatly, and the inversion to n-type, energy losses and/or current noises can be prevented from occurring.

The present inventors further revealed that there is a close relation between, after heat treatment in the device processing step, namely the amount of oxygen donors after the heat treatment for oxygen donor formation, and the amount of residual oxygen in the wafer before that heat treatment.

FIG. 2 is a schematic representation of the relation between the amount of residual oxygen in wafer and the amount of oxygen donors formed after heat treatment, with the heat treatment conditions in the device manufacturing process being taken as parameters. The amount of oxygen donors formed as found after heat treatment greatly depends on the residual oxygen content in wafer before heat treatment and, when the heat treatment conditions to be employed in the device manufacture are selected, the relation between the residual oxygen content in wafer and the amount of oxygen donors formed as found after heat treatment is definitely determined with no alternative.

Specifically, the sintering heat treatment in the wiring sintering step can be considered as the heat treatment in the device manufacturing process, and the heating conditions are 400° C.×1 hour to 450° C.×5 hours. While 4 sets (A to D) of heat treatment conditions are shown in FIG. 2 based on the predicted behaviors of the residual oxygen in wafer during heat treatment, the heat treatment conditions A may be regarded as referring to 5 hours of heat treatment at 450° C., and the heat treatment conditions D as referring to 1 hour of heat treatment at 400° C.

As mentioned above, in the case of high-resistance wafers with an initial resistance of 100 Ωcm or above, when the amount of oxygen donors formed as found after heat treatment in the device manufacturing process is $1 \times 10^{13}$ atoms/cm$^3$ or below, the resistivity can be maintained thereafter at a high level and the changes in resistivity within the wafer inside can be avoided. Therefore, if the permissible limit level of oxygen donors after heat treatment in the device manufacturing process is set to $1 \times 10^{13}$ atoms/cm$^3$ or below and the amount of residual oxygen in wafer can be controlled, the excessive formation of oxygen precipitates and the resulting excessive decrease in residual oxygen concentration in wafer can be avoided.

Thus, based on the relations shown in FIG. 2, the residual oxygen concentration in wafer which satisfies the requirement concerning the permissible level of oxygen donors can be determined for each set of heat treatment conditions in the device manufacturing process. The residual oxygen concentrations in wafer as determined for the sets A to D of heat treatment conditions are a, b, c and d, respectively (a<b<c<d).

If, here, the residual oxygen concentration a is taken as the lower limit to the residual oxygen concentration in wafer and the residual oxygen concentration d as the upper limit, it is possible to meet the requirement concerning the permissible limit level of oxygen donors even after heat treatment in the device manufacturing process by appropriately combining with the heat treatment conditions in the device manufacturing process.

Thus, by revealing the permissible limit level of oxygen donors and preventing the excessive formation of oxygen donors or, in other words, by avoiding the excessive reduction in residual oxygen content, it becomes possible to render the long-duration oxygen precipitation heat treatment unnecessary, reduce the production cost and avoid the deterioration in mechanical strength of wafers.

The present invention has been completed based on the investigation results and findings mentioned above. The present invention consists in the processes for producing high-resistance silicon wafers as described below under (1) to (5).

(1) A process for producing high-resistance silicon wafers wherein it comprises subjecting silicon wafers obtained by the CZ method and having a resistivity of 100 Ωcm or above, an initial interstitial oxygen concentration of $8 \times 10^{17}$ atoms/cm$^3$ or above (ASTM F 121-1979) and, further, a carbon concentration of $5 \times 10^{15}$ to $5 \times 10^{17}$ atoms/cm$^3$ (ASTM F 123-1981) to a first heat treatment consisting in 0.5 to 5 hours of heat treatment at 850-1000° C. employing a rate of heat-up of 0.5 to 10° C./minute at least in the temperature range of 700-850° C. and, further, to a second heat treatment consisting in 1 to 2 hours of heat treatment at 1150° C. or above, followed by subsequent lowering of the temperature and heat treating at 1000-1150° C. for 2 to 10 hours.

(2) In a process for producing high-resistance silicon wafers according to (1), when silicon wafers having an initial interstitial oxygen concentration of $13 \times 10^{17}$ atoms/cm$^3$ (ASTM F 121-1979) or above are used, the above-mentioned second heat treatment preferably consists in 1 to 2 hours of heat treatment at 1150° C. or above alone. The above-mentioned first heat treatment and second heat treatment are preferably carried out successively in a non-oxidizing atmosphere.

(3) In a process for producing high-resistance silicon wafers according to (1), when the silicon wafers obtained are subjected to heat treatment in the device manufacturing process, the amount of oxygen donors generated within the wafers is preferably $1 \times 10^{13}$ atoms/cm$^3$ or below.

(4) In a process for producing high-resistance silicon wafers according to (1), the silicon wafers obtained preferably have a residual oxygen concentration of $6.5 \times 10^{17}$ atoms/cm$^3$ or above (ASTM F 121-1979) but $13.5 \times 10^{17}$ atoms/cm$^3$ or below (ASTM F 121-1979) and, when they are subjected to heat treatment in the device manufacturing process, the amount of oxygen donors generated within the wafers is preferably $1 \times 10^{13}$ atoms/cm$^3$ or below.

(5) Further, in a process for producing high-resistance silicon wafers according to (1), it is preferable that an epitaxial layer be formed on the surface of each silicon wafer obtained or SIMOX type SOI wafers or bonded-type SOI wafers be produced using the high-resistance silicon wafers obtained as base substrates.

BRIEF DESCRIPTION OF THE DRAWINGS

FIG. 3 (a) shows the heating conditions in the first heat treatment, and FIG. 3 (b) shows the heating conditions in the second heat treatment.

BEST MODE FOR CARRYING OUT THE INVENTION

Figure 1:
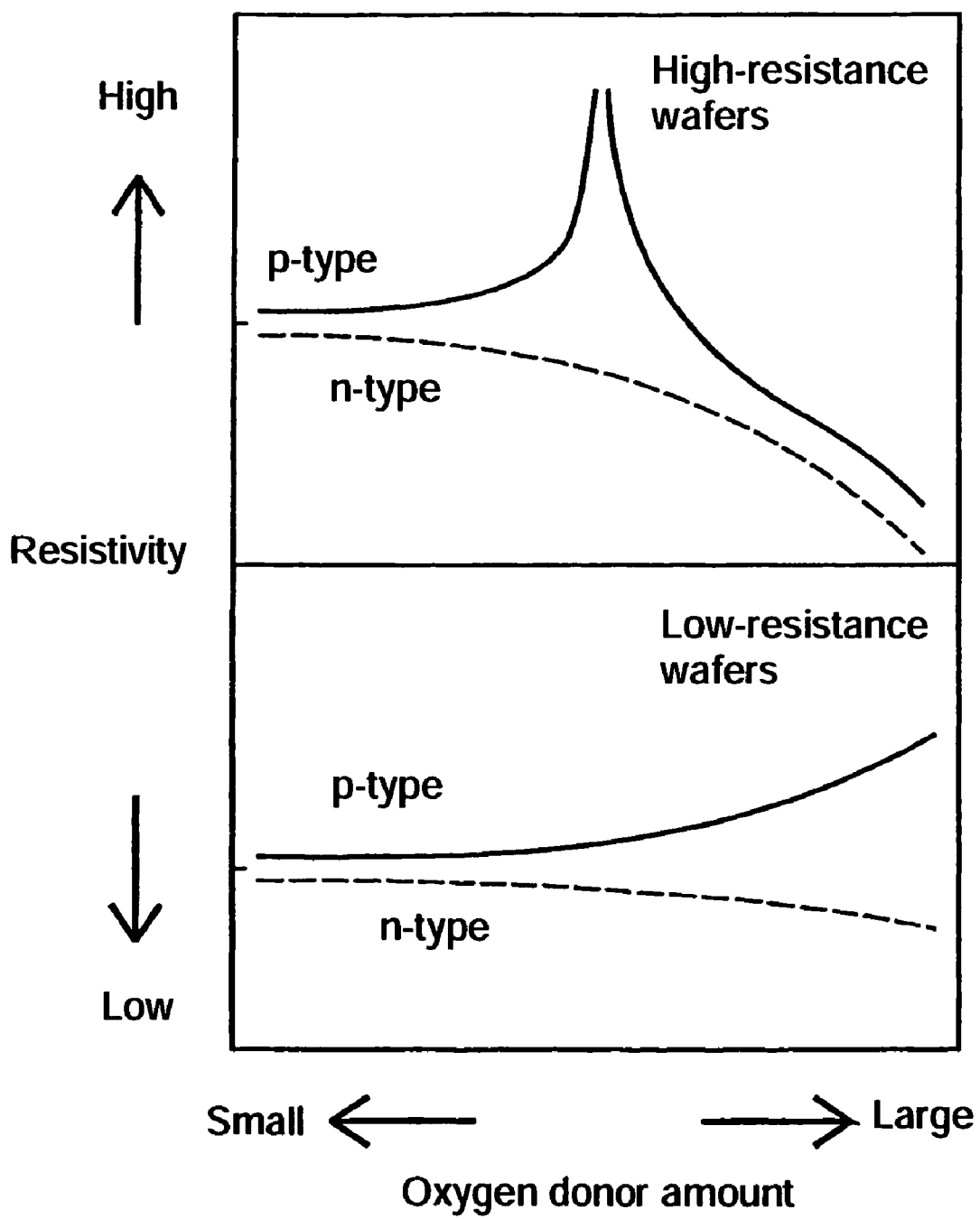
FIG. 1 is a schematic representation of the relation between the amount of oxygen donors formed and the wafer resistivity.

The production process of the present invention is to be applied to silicon wafers produced by the CZ method and having a resistivity of 100 Ωcm or above, an initial interstitial oxygen concentration of $8\times10^{17}$ atoms/cm$^3$ or above (ASTM F 121-1979) and, further, a carbon concentration of $5\times10^{15}$ to $5\times10^{17}$ atoms/cm$^3$ (ASTM F 123-1981).

The resistivity should be 100 Ωcm or above because when the frequency range applicable to devices becomes high and, in particular, exceeds 2.4 GHz or 5.2 GHz, the conventional substrates having a resistivity of 10 Ωcm or below cause significant noise generation and/or signal attenuation while these influences can be reduced by using high-resistance ones.

By the requirement that the wafers should have an initial interstitial oxygen (solute oxygen) concentration of $8\times10^{17}$ atoms/cm$^3$ or above (ASTM F 121-1979), it is intended that the solute oxygen which general-purpose silicon single crystals produced by the ordinary CZ method have be included in that oxygen concentration. It is preferable, however, that the oxygen in the wafer inside (bulk portion) occur as oxygen precipitates which form BMDs (bulk micro defects) having gettering activity.

Carbon, being electrically neutral, promotes the formation of oxygen precipitates having gettering activity, and, when otherwise the wafer strength decreases as a result of a decrease in the amount of interstitial oxygen (solute oxygen) upon heat treatment, it is effective in maintaining the strength, further promoting oxygen precipitation and being also effective in inhibiting the formation of oxygen donors. For achieving these effects, $5\times10^{15}$ to $5\times10^{17}$ atoms/cm$^3$ (ASTM F 123-1981) of carbon is caused to be contained in the wafers.

In that case, when the carbon content is lower than $5\times10^{15}$ atoms/cm$^3$ (ASTM F 123-1981), the effects are produced only insufficiently and, when it is excessive, polycrystal formation or dislocations tend to occur in the single crystal growth by the CZ method and, therefore, it should be $5\times10^{17}$ atoms/cm$^3$ or below (ASTM F 123-1981). By controlling the carbon concentration within this range, it becomes possible to promote the oxygen precipitation and for the oxygen donor formation to be also effectively inhibited, without causing such problems as dislocations.

The production process of the present invention is characterized in that the high-resistance silicon wafers mentioned above are used and subjected to the two-stage heat treatment comprising the first heat treatment and second heat treatment. It is essential that the first heat treatment be carried out at 850-1000° C. for 0.5 to 5 hours while adjusting the heat-up rate to 0.5 to 10° C./minute at least within the temperature range of 700-850° C. In this first heat treatment, the formation of minute precipitation nuclei and the growth thereof are promoted by the controlled heat-up procedure (ramping) from a low temperature.

On the other hand, in the second heat treatment, it is essential that 1 to 2 hours of heat treatment at 1150° C. or above be followed by temperature lowering to 1000-1150° C. and further followed by 2 to 10 hours of heat treatment in that temperature range. The second heat treatment is carried out for the purpose of outward-diffusion heat treatment and for promoting the growth of precipitates.

Figure 3:
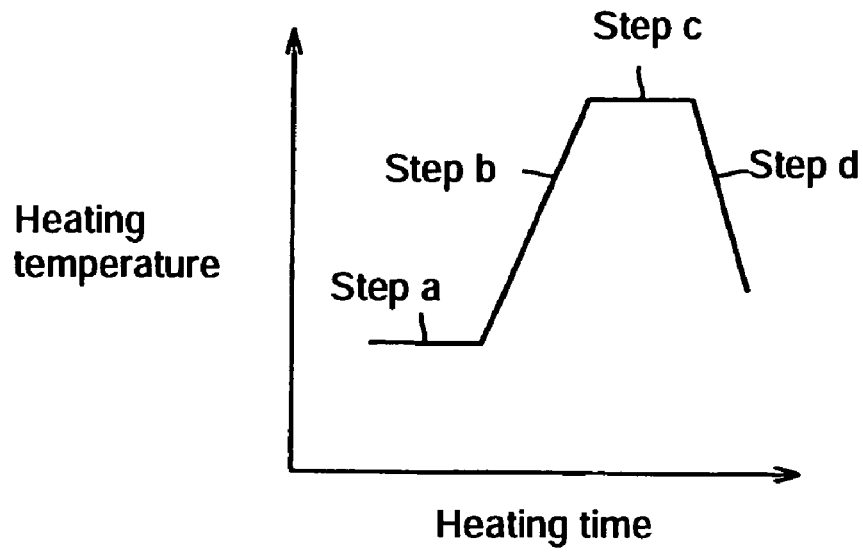
FIG. 3 shows the heating temperature and heating time conditions in the two-stage heat treatment according to the present invention.
Figure 3:
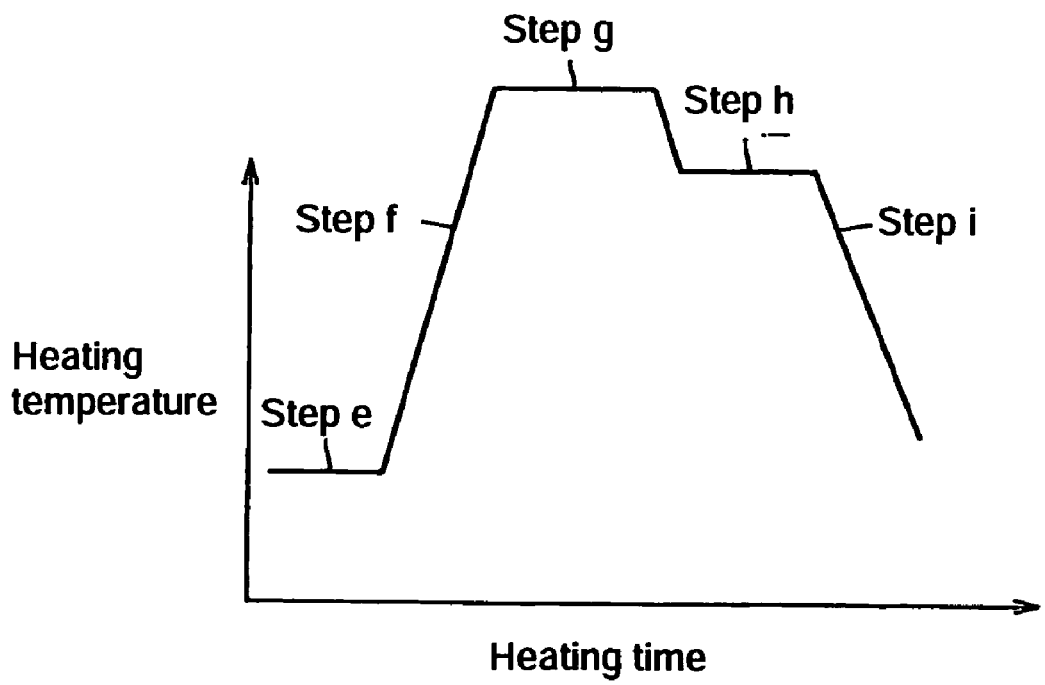

FIG. 3 shows the heating temperature and heating time conditions in the two-stage heat treatment according to the present invention. FIG. 3 (a) shows the heating conditions in the first heat treatment, and FIG. 3 (b) shows the heating conditions in the second heat treatment. A horizontal furnace, for instance, is used as the furnace for wafer heat treatment according to the present invention.

(First Heat Treatment)

In the first heat treatment, the wafers are charged into a heat treatment furnace adjusted to a temperature within the range of 550-800° C. (step a) and, in the subsequent heat-up procedure, the heat-up rate is adjusted to 0.5 to 10° C./minute at least in the temperature range of 700-850° C. (step b). By this heat-up procedure in this step b, it becomes possible to form oxygen precipitation nuclei within the wafers and improve the density of oxygen precipitation nuclei.

Then, heat treatment is carried out in the temperature range of 850-1000° C. for 0.5 to 5 hours (step c). In this step c, the growth of oxygen precipitation nuclei is to be promoted to an extent such that the internal oxygen precipitation nuclei will not disappear in the heat treatment in the step f mentioned later herein and, therefore, the controlled heat-up procedure (ramping) may be carried out in the temperature range of 850-1000° C.

Thereafter, the temperature is lowered and the wafers are discharged of the heat treatment furnace (step d). In cases where the second heat treatment is carried out in succession, it is not necessary to discharge the wafers out of the heat treatment furnace.

The reason why the temperature in the heat treatment furnace is maintained in the range of 550-800° C. in the step a is that this temperature range is the temperature range in which the growth of oxygen precipitation nuclei can be promoted.

The temperature range which is important in the heat-up procedure in the step b is 700-850° C. The heat-up rate in this temperature range is adjusted to 0.5 to 10° C./minute because, at a rate lower than 0.5° C./minute, the growth of minute precipitation nuclei is still possible but a long period of time is required for the heat treatment and this means an increased cost and, at a heat-up rate exceeding 10° C./minute, the growth of minute precipitation nuclei is inhibited, hence the density of precipitation nuclei cannot be increased.

In the above step c, heat treatment is carried out at 850-1000° C. for 0.5 to 5 hours because when the heat treatment is carried out at below 850° C. or for a period shorter than 0.5 hour, the growth of precipitation nuclei is insufficient and, when the heat treatment is carried out at a temperature exceeding 1000° C. or for a period longer than 5 hours, the growth of precipitation nuclei becomes excessive. So long as the heating conditions mentioned above are satisfied, the heat-up may be carried out in a controlled manner (ramping) in the above step c.

(Second Heat Treatment)

In the second heat treatment, the wafers are charged into a heat treatment furnace (steps e and f) and, after heating up, they are subjected to heat treatment at 1150° C. or above for 1 to 2 hours (step g). The temperature is then lowered to a level within the range of 1000-1150° C. and heat treatment is carried out for 2 to 10 hours (step h). Thereafter, the temperature is lowered and the wafers are discharged out of the heat treatment furnace (step i).

In the step g mentioned above, the heating temperature is 1150° C. or above so that the oxygen concentration in the vicinity of the surface may be lowered by outward-diffusion and, at the same time, such defects as COPs (crystal oriented particles) may be dissolved and the integrity in the vicinity of the wafer surface may be increased. At below 1150° C., the ability to lower the density of such defects as COPs decreases. On the other hand, at heating temperatures exceeding 1350° C., slips may occur in the wafers and/or metal contamination may occur during the process. Therefore, the upper limit to the heating temperature in step g is preferably set at 1350° C.

The heating time in step g is 1 to 2 hours. This is because when it is shorter than 1 hour, the density of such defects as COPs cannot be reduced to a satisfactory extent and, when it exceeds 2 hours, there arises a fear of slipping and/or metal contamination.

The heating temperature in step h is 1000-1150° C. This is because the growth of oxygen precipitates cannot be promoted at below 1000° C. and, at above 1150° C., oxygen precipitates are dissolved and the precipitate density decreases.

Figure 4:
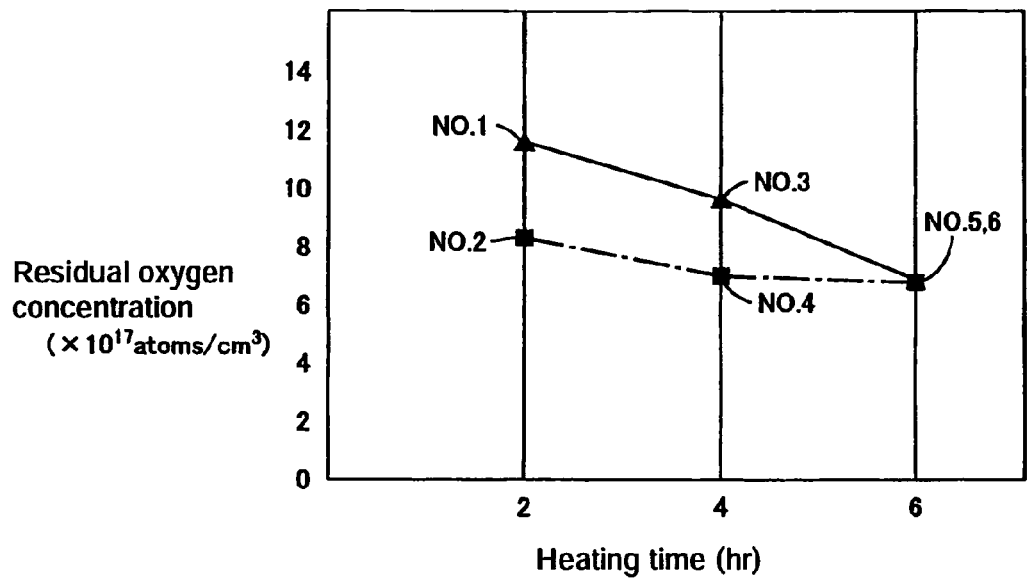
FIG. 4 is a graphic representation of the influence of the heating time in the medium temperature heat treatment in the second heat treatment according to the present invention on the residual oxygen concentration in wafer.

Further, the heating time in step h is 2 to 10 hours. This is because when it is shorter than 2 hours, the growth of oxygen precipitates is insufficient and, when it exceeds 10 hours, the growth of precipitates becomes excessive and possibly promotes the deterioration in wafer mechanical strength. As shown in FIG. 4, which is to be described later herein, it becomes possible to promote the growth of oxygen precipitates and control the residual oxygen concentration in wafer by adjusting the heating time in step h.

When, on the other hand, wafers having a high oxygen concentration are used, the growth of minute precipitation nuclei is promoted sufficiently in the first heat treatment and the nucleus growth arrives at a saturated condition, so that, in some instances, the growth of oxygen precipitates cannot be attained in the second heat treatment. In such cases, the step h may be omitted.

In the second heat treatment, the temperature at which the wafers are discharged in the above-mentioned step i is not restricted but preferably is 600-800° C. When the discharge temperature is lower than 600° C., oxygen donors may possibly be formed and, at above 800° C., slips (dislocations) may readily be introduced into the wafers, possibly causing cracks in the wafers.

(Heat Treatment Atmosphere)

The atmosphere in the first heat treatment may be an oxidizing atmosphere or a non-oxidizing atmosphere. Preferably used as the gas constituting the non-oxidizing atmosphere is argon (Ar), hydrogen ($H_2$) or mixture of these (Ar+$H_2$), or a mixed gas composed of nitrogen ($N_2$) and a small proportion of oxygen (3% $O_2$).

Meanwhile, when the heat treatment is carried out in an oxidizing atmosphere or in a pure $N_2$ gas atmosphere, an oxide film or nitride film is formed on the wafer surface and, therefore, a step of removing such layer (e.g. cleaning with hydrofluoric acid) becomes necessary. Therefore, a non-oxidizing atmosphere is preferably used as the atmosphere in the first heat treatment. In that case, the use of a mixed gas composed of $N_2$ and a small proportion of oxygen (3% $O_2$) is more preferable, since Ar and $H_2$ gases are expensive.

Preferably, a non-oxidizing atmosphere is used as the atmosphere in the second heat treatment, and Ar, $H_2$, Ar+$H_2$, and $N_2$ gas (containing 3% $O_2$) can be used. $N_2$ gas (containing 3% $O_2$) effectively causes outward-diffusion of oxygen and can form a DZ (denuded zone) layer but is not effective in causing COPs occurring on the wafer surface layer portion to disappear. Therefore, it is preferable that a non-oxidizing atmosphere be selected and Ar, $H_2$ or Ar+$H_2$ gas be employed as the atmosphere in the second heat treatment.

For efficiently carrying out the first heat treatment and second heat treatment, it is preferable that both the heat treatments be carried out successively using the same gas atmosphere and the same heat treatment apparatus or a series of heat treatment furnaces. In this case, the step d in the first heat treatment and the step e in the second heat treatment, both shown in FIG. 3, can be omitted.

(Level of Formation of Oxygen Donors)

When the silicon wafers obtained in the production process of the present invention are subjected to heat treatment in the process of device manufacture, the amount of oxygen donors formed within the wafers is preferably $1 \times 10^{13}$ atoms/cm$^3$ or below.

For example, when wafers having a high resistivity 100 Ωcm or above are subjected to heat treatment at 400° C. to 450° C. for 1 to 5 hours as the heat treatment for oxygen donor formation and the amount of oxygen donors formed as found after heat treatment is $1 \times 10^{13}$ atoms/cm$^3$ or below, the wafer resistivity can be maintained thereafter at a high level, while preventing any great changes in resistance value or the inversion into n-type and, further, preventing the occurrence of energy losses and current noises.

(Residual Oxygen Concentration)

In the production process of the present invention, the silicon wafers obtained preferably have a residual oxygen concentration of $6.5 \times 10^{17}$ atoms/cm$^3$ or above (ASTM F 121-1979) but $13.5 \times 10^{17}$ atoms/cm$^3$ or below (ASTM F 121-1979) and, when they are subjected to heat treatment in the device manufacturing process, the amount of oxygen donors formed within the wafers is preferably $1 \times 10^{13}$ atoms/cm$^3$ or below.

Figure 2:
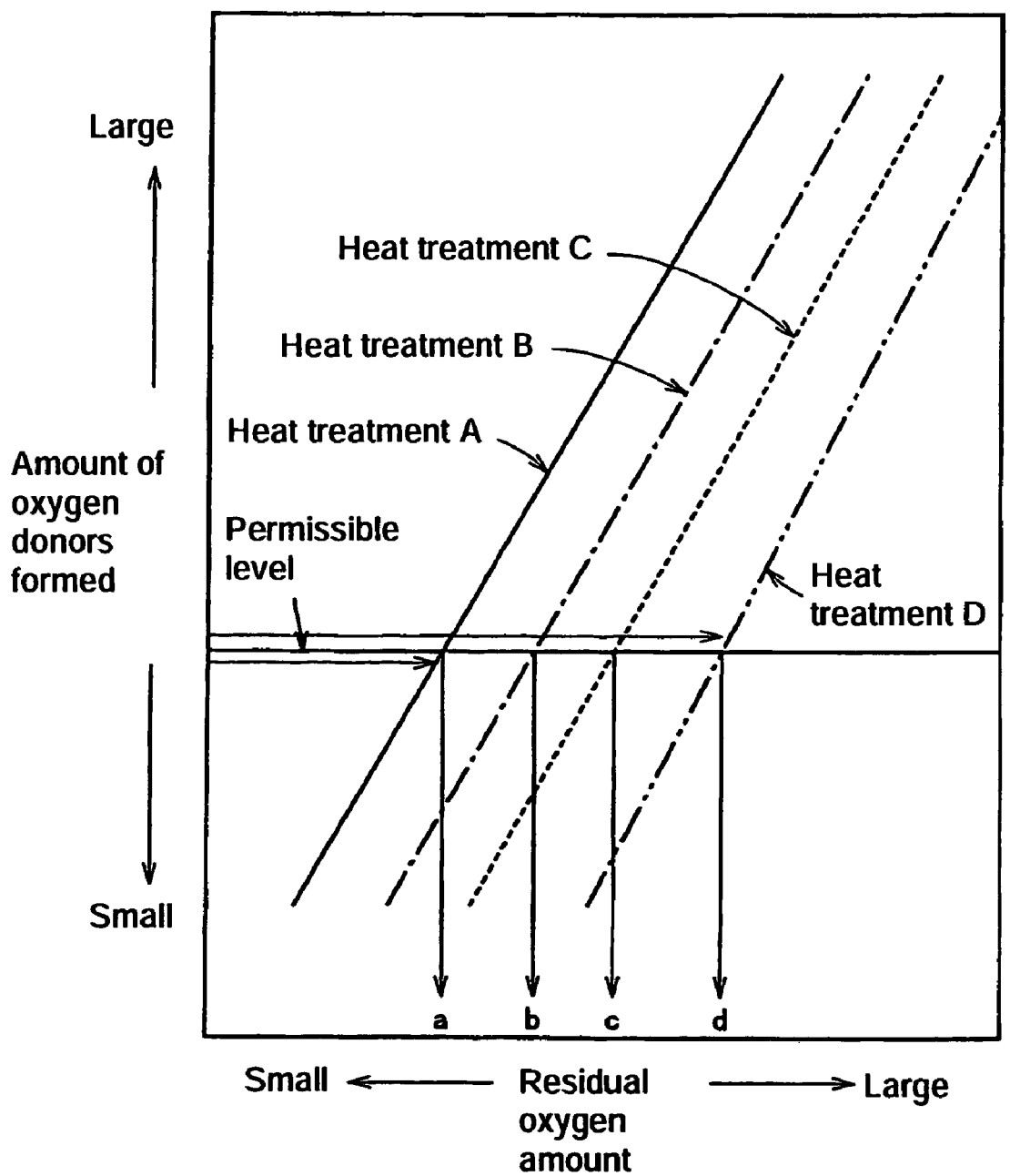
FIG. 2 is a schematic representation of the relations between the amount of residual oxygen in wafer and the amount of oxygen donors formed as found after heat treatment, with the heat treatment conditions in the device manufacturing process being taken as parameters.

FIG. 2 referred to hereinabove is a representation of the relation between the amount of residual oxygen in wafer and the amount of oxygen donors formed as found after heat treatment in the device manufacturing process. First, for avoiding an excessive reduction in residual oxygen content in wafer, a lower limit to the residual oxygen concentration in wafer is searched for. In this case, the heat treatment conditions A shown in FIG. 2, which are heat treatment conditions most effective in promoting the formation of oxygen donors, are employed.

On the other hand, by using the heat treatment conditions D shown in FIG. 2, which cause the least formation of oxygen donors among the heat treatment conditions in the device manufacturing process, it becomes possible to determine an upper concentration limit to the residual oxygen in wafer corresponding to the permissible oxygen donor content.

In determining the upper and lower concentration limits to the residual oxygen in wafer, the heat treatment conditions in the device manufacturing process are, first of all, specified and master tables are prepared which show the relation between the amount of residual oxygen in wafer and the amount of oxygen donors formed as found after heat treatment in the device manufacturing process. As examples of such master tables, there may be mentioned the relations between the amount of residual oxygen in wafer and the amount of oxygen donors as found after heat treatment, with the heat treatment conditions A and D being taken as parameters, as shown in FIG. 2.

By determining, based on these master tables, the residual oxygen concentrations in wafer, a and d, considering the permissible level (upper limit value) of oxygen donors after heat treatment, namely $1\times10^{13}$ atoms/cm$^3$, a lower limit and an upper limit to the residual oxygen concentration which the high-resistance wafers of the present invention preferably have are determined.

More specifically, for determining the residual oxygen concentrations in wafer, a and d, subwafers were prepared by processing a crystal grown by the CZ method into 8-inch p-type wafers having a resistivity of 2000 Ωcm, an initial interstitial oxygen concentration of 13 to $15\times10^{17}$ atoms/cm$^3$ (ASTM F 121-1979) and, further, a carbon concentration of $5\times10^{16}$ atoms/cm$^3$ (ASTM F 123-1981) and subjecting them to 1 hour of donor killer heat treatment at 650° C.

The subwafers prepared were subjected to 1 hour of heat treatment at 900° C. using a N$_2$ (containing 3% O$_2$) gas atmosphere following wafer charging at 700° C. and heating up at a rate of 1° C./minute, as the first heat treatment. Then, 1 hour of heat treatment at 1200° C. using an Ar gas atmosphere was carried out as the second heat treatment, followed by 10 hours of heat treatment after temperature lowering to 1000° C.

The wafers obtained were subjected to oxygen donor formation heat treatment at 450° C. for 5 hours using a N$_2$ (containing 3% O$_2$) gas, and a master table showing the relation between the amount of residual oxygen in wafer and the amount of donor formed as found after heat treatment, as shown in FIG. 2, was drawn up with the heat treatment conditions A being taken as a parameter. According to the same procedure, the oxygen donor formation heat treatment was carried out at 400° C. for 1 hour, and a master table for the heat treatment conditions D was drawn up, as shown in FIG. 2.

Based on these master tables, the lower and upper concentration limits to the residual oxygen in wafer were determined considering the permissible oxygen donor level after heat treatment. The results shown in Table 1 were obtained.

TABLE 1

| Item | Master table for lower concentration limit determination | Master table for upper concentration limit determination |
| --- | --- | --- |
| Oxygen donor formation heat treatment | 450° C. × 5 Hr (Heat treatment conditions A) | 400° C. × 1 Hr (Heat treatment conditions D) |
| Permissible oxygen donor concentration (upper limit) | $1\times10^{13}$ atoms/cm$^3$ | $1\times10^{13}$ atoms/cm$^3$ |
| Residual oxygen concentration in wafer | $6.5\times10^{17}$ atoms/cm$^3$ | $13.5\times10^{17}$ atoms/cm$^3$ |

The results shown in Table 1 indicate that the silicon wafers obtained by the process of the present invention preferably have a residual oxygen concentration of $6.5\times10^{17}$ atoms/cm$^3$ or above but $13.5\times10^{17}$ atoms/cm$^3$ or below and that when such wafers are subjected to heat treatment in the device manufacturing process, the requirement that the amount of oxygen donors formed inside the wafer should be $1\times10^{13}$ atoms/cm$^3$ or below can be satisfied.

(Medium Temperature Heat Treatment in the Second Heat Treatment).

In accordance with the production process of the present invention, the residual oxygen concentration in wafer can be controlled by adjusting the heating time in the medium temperature heat treatment (step h in FIG. 3) in the second heat treatment.

FIG. 4 is a graphic representation of the influence of the heating time in the medium temperature heat treatment in the second heat treatment according to the present invention on the residual oxygen concentration in wafer. The residual oxygen concentration in wafer depends on the medium temperature heat treatment conditions in the second heat treatment.

For confirming this, 8-inch p-type wafers were prepared by the CZ method and test specimens for Tests Nos. 1-6 were prepared. The particulars of the subwafers and the heat treatment conditions of the test specimens were as follows.

(1) Subwafer Conditions
  a. Carbon concentration $5\times10^{16}$ atoms/cm$^3$ (ASTM F 123-1981).
  b. Resistivity 600 Ωcm (Tests Nos. 1-4),
    Initial interstitial oxygen concentration $13.5\times10^{17}$ atoms/cm$^3$ (Tests Nos. 1-4).
  c. Resistivity 3000 Ωcm (Tests Nos. 5-6),
    Initial interstitial oxygen concentration $15\times10^{17}$ atoms/cm$^3$ (Tests Nos. 5-6).
  d. After processing into wafers, donor killer heat treatment was carried out at 650° C. for 1 hour.

(2) First Heat Treatment Conditions
  a. Charging temperature 700° C., heat-up rate 1° C./minute, with N$_2$ (containing 3% O$_2$) gas atmosphere being used.
  b. Constant temperature heat treatment at 900° C. for 1 hour (Tests Nos. 1, 3 and 5).
  c. Constant temperature heat treatment at 950° C. for 1 hour (Tests Nos. 2, 4 and 6).

(3) Second Heat Treatment Conditions
  a. Wafer charging temperature 700° C., with an Ar gas atmosphere being used.
  b. Constant temperature heat treatment at 1200° C. for 1 hour.
  c. After temperature lowering, 2 hours of constant temperature heat treatment at 1000° C. (Tests Nos. 1 and 2).
  d. After temperature lowering, 4 hours of constant temperature heat treatment at 1000° C. (Tests Nos. 3 and 4).
  e. After temperature lowering, 6 hours of constant temperature heat treatment at 1000° C. (Tests Nos. 5 and 6).

From the results shown in FIG. 4, it is seen that the residual oxygen concentration in wafer can be controlled within the range of $6.5\times10^{17}$ to $12.0\times10^{17}$ atoms/cm$^3$ by changing the heating time at 1000° C. after temperature lowing from 2 hours to 4 hours or 6 hours.

In spite of the results shown in FIG. 4, when silicon wafers having an initial interstitial oxygen (soluble oxygen) concentration of $13\times10^{17}$ atoms/cm$^3$ (ASTM F 121-1979) or above are used, the influence of the heating time in the medium temperature heat treatment (step h in FIG. 3) in the second heat treatment on the residual oxygen concentration in wafer is slight.

This is because when the wafers have a relatively high initial interstitial oxygen (soluble oxygen) concentration, the growth of minute precipitation nuclei can be sufficiently promoted by the programmed heat-up procedure in the first heat treatment until arrival of the nucleus growth at a saturated state. Thus, even when the wafers are thereafter subjected to 2 to 10 hours of heat treatment in the step h in the second heat treatment, the influence thereof on the growth of oxygen precipitates becomes decreased.

Figure 5:
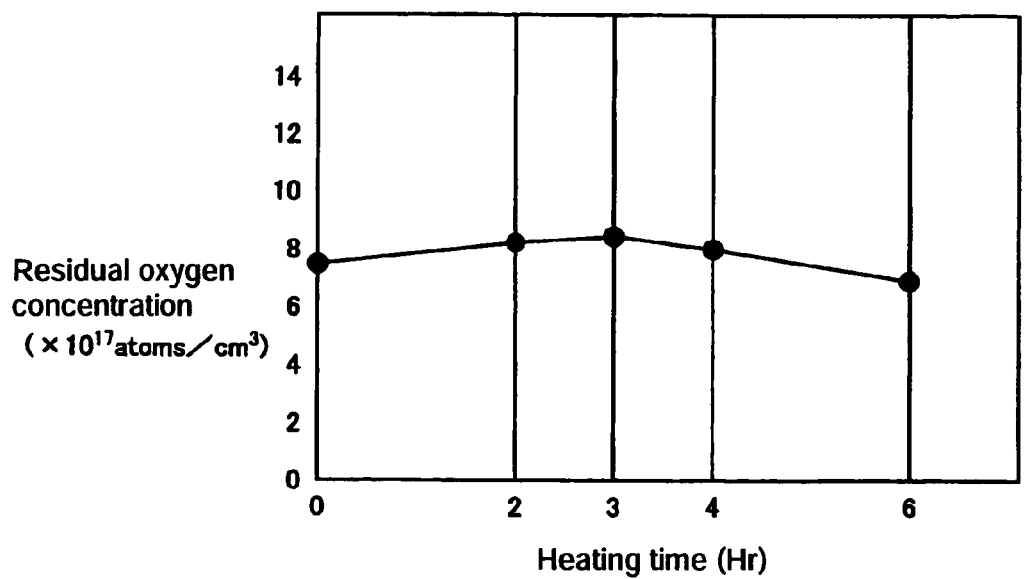
FIG. 5 is a graphic representation of the influence of the heating time in the medium temperature heat treatment in the second heat treatment according to the present invention on the residual oxygen concentration in wafer for the case of using wafers having a high initial interstitial oxygen concentration.

FIG. 5 is a graphic representation of the influence of the heating time in the medium temperature heat treatment in the second heat treatment according to the present invention on the residual oxygen concentration in wafer for the case of the use of wafers having a high initial interstitial oxygen concentration. When wafers having a high initial interstitial oxygen concentration are used, the influence of the heating time in the step h in the second heat treatment on the residual oxygen concentration in wafer becomes less.

For confirming this, test specimens were prepared using 8-inch p-type wafers obtained by the CZ method. The particulars of the subwafers and the heat treatment conditions were as follows.

(1) Subwafer Conditions
   a. Carbon concentration $5\times10^{16}$ atoms/cm$^3$ (ASTM F 123-1981).
   b. Resistivity 3000 Ωcm
      Initial interstitial oxygen concentration $15\times10^{17}$ atoms/cm$^3$.
   d. After processing into wafers, donor killer heat treatment was carried out at 650° C. for 1 hour.

(2) First Heat Treatment Conditions
   a. Charging temperature 700° C., heat-up rate 1° C./minute, with N$_2$ (containing 3% O$_2$) gas atmosphere being used.
   b. Constant temperature heat treatment at 900° C. for 1 hour.

(3) Second Heat Treatment Conditions
   a. Wafer charging temperature 700° C., with an Ar gas atmosphere being used.
   b. Isothermal heat treatment at 1200° C. for 1 hour.
   c. After temperature lowering, isothermal heat treatment at 1000° C. for 0, 2, 4 or 6 hours.

From the results shown in FIG. 5, it is seen that when the time of heating at 1000° C. after temperature lowering to that level is varied within the range of 0-6 hours in the second heat treatment of the present invention in the case of using wafers having a high initial interstitial oxygen concentration, the influence thereof on the residual oxygen concentration in wafer is slight and that concentration is satisfactorily within the range of $6.5\times10^{17}$ to $12.0\times10^{17}$ atoms/cm$^3$ in each case.

Thus, when wafers having a relatively high initial interstitial oxygen concentration $13\times10^{17}$ atoms/cm$^3$ or above are used, the desired residual oxygen concentration in wafer can be secured even if the constant temperature treatment in the step h in the second heat treatment is omitted. Therefore, the 1 to 2 hours of heat treatment at 1150° C. alone can be carried out as the second heat treatment, while omitting the isothermal heat treatment in step h in the second heat treatment. This is preferable since the cost of production of high-resistance silicon wafers can be markedly reduced.

Furthermore, it has been confirmed that in cases where wafers having a high initial interstitial oxygen concentration are used, the predetermined residual oxygen concentration in wafer can be secured even when the programmed temperature raising procedure in the first heat treatment for promoting the growth of minute precipitation nuclei is not employed. In the following, this heat treatment is described in some detail as a third heat treatment.

Figure 6:
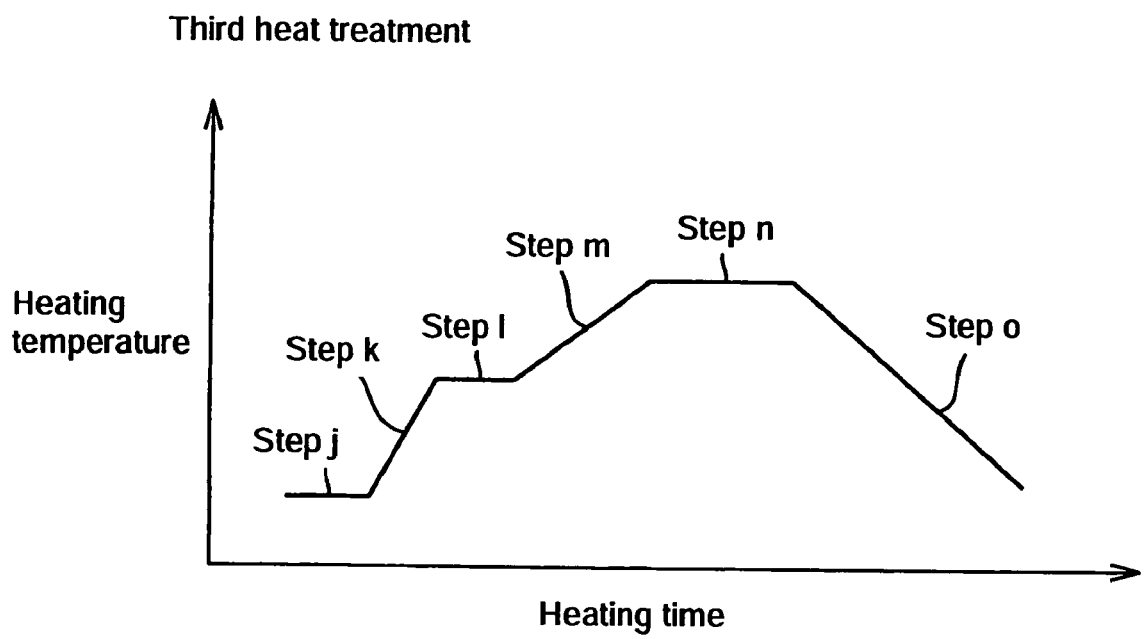
FIG. 6 is a graphic representation of the heating temperature and heating time conditions in a third heat treatment.

FIG. 6 is a drawing showing the heating temperature and heating time conditions in the third heat treatment. For example, in the third heat treatment, the wafers are charged into a heat treatment furnace (step j) and, after the subsequent temperature raising procedure (step k), heat treatment is carried out within the temperature range around 1000° C. (step l) and, after further temperature raising and high-temperature heat treatment (steps m and n), the temperature is lowered (step o) and the wafers are discharged out of the heat treatment furnace.

Figure 7:
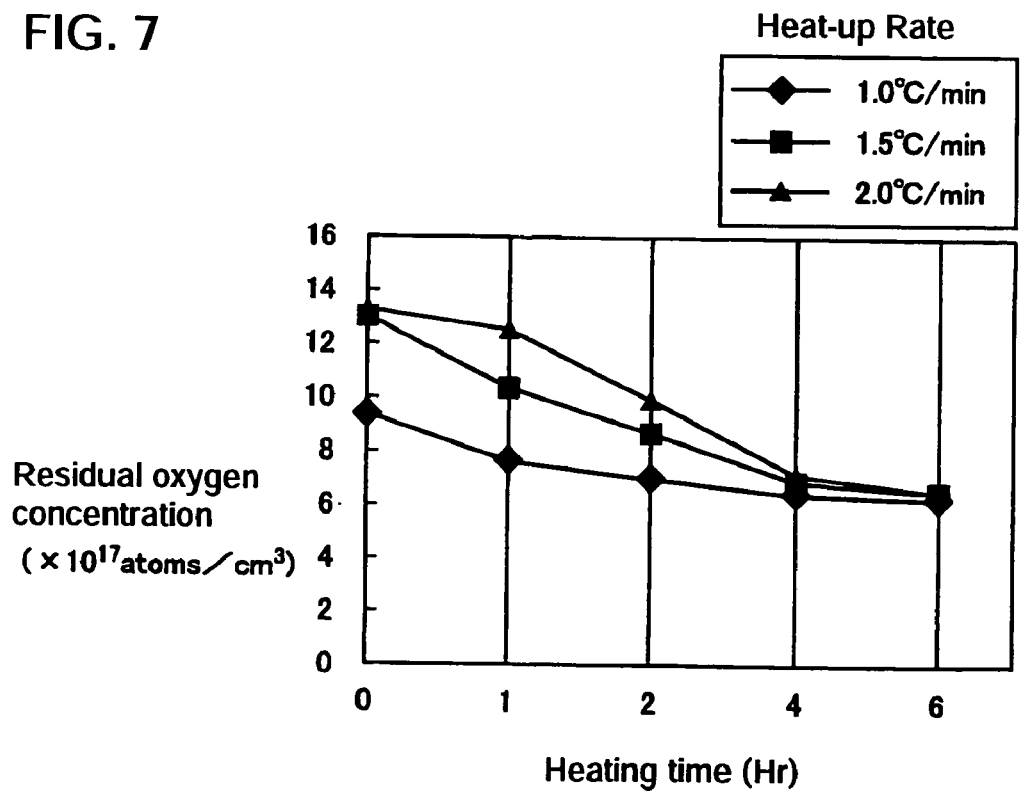
FIG. 7 is a graphic representation of the influences of the heating time in the third heat treatment carried out at 1000° C. on the residual oxygen concentration in wafer for the case of using wafers having a high initial interstitial oxygen concentration.

FIG. 7 is a graphic representation of the influences of the heating time in the third heat treatment carried out at 1000° C. on the residual oxygen concentration in wafer for the case of using wafers having a high initial interstitial oxygen concentration. Three heat-up rates, namely 1.0° C./minute, 1.5° C./minute and 2.0° C./minute, were employed in the step k. From the results shown in FIG. 7, it is seen that even when the heating time in the heat treatment at 1000° C. is zero hour, the residual oxygen concentration amounts to about $8.8\times10^{17}$ atoms/cm$^3$. Therefore, it is recognizable that in the case of employing the third heat treatment as well, it is possible to adjust the residual oxygen concentration within the range of $6.35\times10^{17}$ to $13.1\times10^{17}$ atoms/cm$^3$ by combining the step k (heat-up procedure) with the step l (heat treatment at 1000° C.).

(Method for Producing Epitaxial Wafers and SOI Wafers)

In accordance with the present invention, it is possible to produce epitaxial wafers by forming an epitaxial layer on the surface of each high-resistance silicon wafer obtained. The epitaxial wafers produced by forming an epitaxial layer on the high-resistance silicon wafers produced by the production process of the present invention have good characteristics and therefore can serve as wafers best suited as substitutes for SOI wafers for mobile telecommunications, for instance.

The epitaxial wafer production conditions are not particularly restricted except for the use of the high-resistance silicon wafers obtained by the production process of the present invention but the ordinary conditions may be employed. As for the epitaxial growth apparatus to be used in the production of epitaxial wafers, any of the epitaxial growth apparatus known in the art, for example of the barrel type, pancake type or single wafer processing type, may be employed, and any of the well-known epitaxial growth methods can be employed.

In accordance with the present invention, SIMOX type SOI wafers can be produced using the high-resistance silicon wafers obtained as base substrates. When produced by using the high-resistance silicon wafers produced by the production process of the present invention, the SIMOX type SOI wafers obtained can serve as SOI wafers best suited for mobile telecommunications.

The SOI wafer production conditions by the SIMOX method are not particularly restricted except for the use of the high-resistance silicon wafers of the present invention. Hence, those conditions in conventional use may be employed. Thus, while an acceleration voltage of 180 keV to 200 keV is generally used among the oxygen implantation conditions in SIMOX wafer production, a voltage higher or lower than that range can also be applied.

As for the dose window of oxygen ions, a dose window of around $4 \times 10^{17}$ cm$^{-2}$ or of $1.0 \times 10^{18}$ cm$^{-2}$ or above is preferably used. A dose window outside this range can also be employed. As for the annealing conditions, the temperature to be used is preferably 1300° C. or higher so that a good buried oxide layer may be obtained. Temperatures lower than the above-mentioned level may also be employed. The atmosphere to be used in annealing may be an oxidizing or non-oxidizing one.

In accordance with the present invention, bonded SOI wafers can be produced using the high-resistance silicon wafers obtained as base substrate side wafers. The bonded SOI wafers produced by using the high-resistance silicon wafers produced by the production process of the present invention as base substrate side wafers are best suited for use as SOI wafers for mobile telecommunications, for instance.

The conditions in producing the bonded SOI wafers are not particularly restricted except for the use of the high-resistance silicon wafers of the present invention as base substrate side wafers. More specifically, other silicon wafers to serve as active layer side ones are prepared, and the active layer side wafers or/and base substrate wafers are subjected to heat treatment at a temperature of 1000° C. or above in an oxidizing atmosphere for thermally oxidized layer formation on the wafer surface.

Then, each active layer side wafer is brought into close contact with each base substrate side wafer, and the active layer side wafer and base substrate side wafer are firmly bonded together by heat treatment to give a bonded wafer. As for the heat treatment conditions for bonding these wafers together, heat treatment may be carried out at 400-1200° C. in an oxygen- or water vapor-containing atmosphere.

More preferably, the heat treatment is carried out at a temperature of 900° C., whereby the two wafers can be firmly bonded together. In the case of producing thick SOI wafers, the high-resistance wafers obtained by the process of the present invention are preferably used also as the active layer side wafers.

EXAMPLES

Example 1

For confirming the effects of the present invention, a crystal grown by the CZ method was processed into 8-inch p-type wafers having a resistivity of 2000 Ωcm, an initial interstitial oxygen concentration of 10 to $15 \times 10^{17}$ atoms/cm$^3$ (ASTM F 121-1979) and, further, a carbon concentration of $5 \times 10^{16}$ atoms/cm$^3$ (ASTM F 123-1981), and subwafers were prepared by subjecting the wafers to 1 hour of donor killer heat treatment at 650° C.

The subwafers prepared were subjected to first heat treatment, namely 1 hour of heat treatment at 900° C., following wafer charging in a furnace at a temperature of 700° C. and heating up at a rate of 1° C./minute, using a N$_2$ (containing 3% O$_2$) gas atmosphere. Then, heat treatment was carried out, as second heat treatment, at 1200° C. for 1 hour using an Ar gas atmosphere. The temperature was then lowered to 1000° C., and heat treatment was carried out at that temperature for 10 hours.

The wafers obtained after the above heat treatment process were subjected to hydrogen baking treatment at about 1180° C. in a horizontal single wafer processing type epitaxial growth furnace and then subjected to silicon epitaxial growth treatment to an epitaxial layer thickness of 5 μm at a temperature of about 1130° C. using trichlorosilane as the raw material source gas.

The epitaxial wafers obtained were subjected to 1 hour of heat treatment at 400° C. in an atmosphere of N$_2$ (containing 3% O$_2$) in a simulation of the heat treatment conditions in the device manufacturing process, and then the amount of oxygen donors generated within each wafer was examined. As a result, each wafer had an oxygen donor content $1 \times 10^{13}$ atoms/cm$^3$ or below and it was thus confirmed that epitaxial wafers showing no changes in resistivity could have been obtained.

Example 2

For confirming the effects of using wafers having a relatively high initial interstitial oxygen concentration, subwafers having a resistivity of 2000 Ωcm, an initial interstitial oxygen concentration of 13 to $15 \times 10^{17}$ atoms/cm$^3$ (ASTM F 121-1979) and, further, a carbon concentration of $5 \times 10^{16}$ atoms/cm$^3$ (ASTM F 123-1981) were prepared in the same manner as in Example 1 by carrying out donor killer heat treatment at 650° C. for 1 hour.

They were subjected to first heat treatment under the same conditions as in Example 1 and then to second heat treatment, namely 1 hour of heat treatment at 1200° C. in an Ar gas atmosphere and thereafter immediately discharged out of the furnace at 600° C. without subjecting to medium temperature treatment. The wafers obtained were subjected to silicon epitaxial growth treatment in a horizontal single wafer processing type growth furnace under the same conditions as in Example 1.

The epitaxial wafers obtained were examined for oxygen donor formation under the same conditions as in Example 1. As a result, each wafer had an oxygen donor content $1 \times 10^{13}$ atoms/cm$^3$ or below. It was thus confirmed that epitaxial wafers showing no changes in resistivity could have been obtained.

Example 3

Silicon wafers were produced in the same manner as in Example 1 by preparing 8-inch p-type subwafers having a resistivity of 2000 Ωcm, an initial interstitial oxygen concentration of 10 to $15 \times 10^{17}$ atoms/cm$^3$ (ASTM F 121-1979) and, further, a carbon concentration of $5 \times 10^{16}$ atoms/cm$^3$ (ASTM F 123-1981) and further subjecting them to first heat treatment and second heat treatment under the same conditions.

Using the thus-produced silicon wafers, oxygen ions were implanted into them from the front surface side at an acceleration voltage of 100 keV These wafers were placed in a heat treatment furnace maintained at 700° C., then heated to 1320° C. and maintained at that temperature for 10 hours. Thereafter, the wafers were cooled to 700° C. and discharged out of the furnace. SIMOX wafers were thus produced.

The SIMOX type SOI wafers obtained were subjected to 1 hour of heat treatment at 400° C. in an atmosphere of N$_2$ (containing 3% O$_2$) in a simulation of the heat treatment conditions in the device manufacturing process and, then, the amounts of oxygen donors generated inside the active layer and base substrate were examined. As a result, all oxygen donor contents were $1 \times 10^{13}$ atoms/cm$^3$ or below, and it was thus confirmed that SIMOX type SOI wafers showing no changes in resistivity could have been obtained.

Example 4

Silicon wafers were produced in the same manner as in Example 1 by preparing 8-inch p-type subwafers having a resistivity of 2000 Ωcm, an initial interstitial oxygen concentration of 10 to 15×10$^{17}$ atoms/cm$^3$ (ASTM F 121-1979) and, further, a carbon concentration of 5×10$^{16}$ atoms/cm$^3$ (ASTM F 123-1981) and further subjecting them to first heat treatment and second heat treatment under the same conditions.

The silicon wafers produced were subjected to heat treatment at 1000° C. in an oxidizing atmosphere to form a thermally oxidized layer on the wafer surface. Then, each of the wafers was brought into close contact with another wafer to serve as an active layer, followed by bonding at a temperature of 1150° C. Thereafter, the active layer side wafer was subjected to polishing and etching treatment to a thickness of 0.5 μm. In this manner, bonded SOI wafers were produced.

The bonded SOI wafers obtained were subjected to 1 hour of heat treatment at 400° C. in an atmosphere of N$_2$ (containing 3% O$_2$) in a simulation of the heat treatment conditions in the device manufacturing process and, then, the amount of oxygen donors formed within each base substrate was examined. As a result, all oxygen donor contents were 1×10$^{13}$ atoms/cm$^3$ or below and, it was thus confirmed that they were bonded SOI wafers showing no changes in resistivity.

INDUSTRIAL APPLICABILITY

By using oxygen-containing silicon wafers obtained by the CZ method and by combining the first heat treatment comprising controlled heat-up operation (ramping) with the second heat treatment comprising high-temperature heat treatment and medium temperature heat treatment in accordance with the process for producing high-resistance silicon wafers according to the present invention, it is possible to obtain high-resistance silicon wafers capable of maintaining their high resistance even after heat treatment in the process of device manufacture while efficiently inhibiting the formation of oxygen donors and preventing changes in resistivity. Further, excellent epitaxial wafers and SOI wafers can be produced using those high-resistance silicon wafers and, therefore, they can be applied in a wide field of use, including high-frequency communication devices and analog/digital hybrid devices, among others.

The invention claimed is:

1. A process for producing high-resistance silicon wafers wherein it comprises subjecting silicon wafers obtained by the Czochralski method and having a resistivity of 100 Ωcm or above, an initial interstitial oxygen concentration of 8×10$^{17}$ atoms/cm$^3$ or above (ASTM F 121-1979) and, further, a carbon concentration of 5×10$^{15}$ to 5×10$^{17}$ atoms/cm$^3$ (ASTM F 123-1981) to first heat treatment consisting in 0.5 to 5 hours of heat treatment at 850-1000° C. employing a rate of heat-up of 0.5 to 10° C./minute at least in the temperature range of 700-850° C. and, further, to second heat treatment consisting in 1 to 2 hours of heat treatment at 1150° C. or above followed by subsequent lowering of the temperature and heat treating at 1000-1150° C. for 2 to 10 hours.

2. A process for producing high-resistance silicon wafers according to claim 1, wherein when silicon wafers having an initial interstitial oxygen concentration of 13×10$^{17}$ atoms/cm$^3$ (ASTM F 121-1979) or above are used, heat treatment at 1150° C. or above alone is carried out for 1 to 2 hours as the second heat treatment.

3. A process for producing high-resistance silicon wafers according to claim 1, wherein the first heat treatment and second heat treatment are carried out successively in a non-oxidizing atmosphere.

4. A process for producing high-resistance silicon wafers according to claim 1, wherein, when the silicon wafers obtained are subjected to heat treatment in the device manufacturing process, the amount of oxygen donors generated within the wafers is 1×10$^{13}$ atoms/cm$^3$ or below.

5. A process for producing high-resistance silicon wafers according to claim 1, wherein the silicon wafers obtained have a residual oxygen concentration of 6.5×10$^{17}$ atoms/cm$^3$ or above (ASTM F 121-1979) but 13.5×10$^{17}$ atoms/cm$^3$ or below (ASTM F 121-1979) and, when they are subjected to heat treatment in the device manufacturing process, the amount of oxygen donors generated within the wafers is 1×10$^{13}$ atoms/cm$^3$ or below.

6. A method of producing epitaxial wafers wherein an epitaxial layer is formed on the surface of high-resistance silicon wafers obtained by the production process according to claim 1.

7. A method of producing SOI wafers wherein SIMOX type SOI wafers are produced using, as base substrates, high-resistance silicon wafers obtained by the production process according to claim 1.

8. A method of producing SOI wafers wherein bonded type SOI wafers are produced using, as base substrate side wafers, high-resistance silicon wafers obtained by the production process according to claim 1.

* * * * *